United States Patent [19]

Barrett et al.

[11] Patent Number: 4,978,841
[45] Date of Patent: Dec. 18, 1990

[54] AUTOMATIC LEVELING SYSTEM AND A METHOD OF LEVELING A WORKPIECE BASED ON FOCUS DETECTION

[75] Inventors: William A. Barrett, San Jose; Amitabh Puri, Santa Clara, both of Calif.

[73] Assignee: Lasa Industries, Inc., San Jose, Calif.

[21] Appl. No.: 398,276

[22] Filed: Aug. 24, 1989

[51] Int. Cl.⁵ ............................................. G01N 21/86
[52] U.S. Cl. .................................... 250/548; 250/561; 356/1; 356/152
[58] Field of Search ..................... 250/201.1, 548, 561; 356/1, 4, 152, 141, 399–401, 138

[56] References Cited

U.S. PATENT DOCUMENTS

| 3,989,385 | 11/1976 | Dill et al. | 356/152 |
| 4,636,628 | 1/1987 | Tsukai | 250/201.1 |
| 4,704,020 | 11/1987 | Murakami et al. | 356/152 |
| 4,770,531 | 9/1988 | Tanaka et al. | 356/401 |

Primary Examiner—David C. Nelms
Assistant Examiner—Khaled Shami
Attorney, Agent, or Firm—Cushman, Darby & Cushman

[57] ABSTRACT

An automatic leveling system and a method of use of the leveling system that is suited for use with electronic components. The system uses an automatic laser focus system to focus on three separate locations on a workpiece, and the information about the focus positions is sent to a control computer. In the control computer the focus information is transformed into information concerning how far the workpiece is from being level. The computer sends signals to pitch and roll goniometers that move in response to the signals, thus leveling the workpiece.

10 Claims, 2 Drawing Sheets

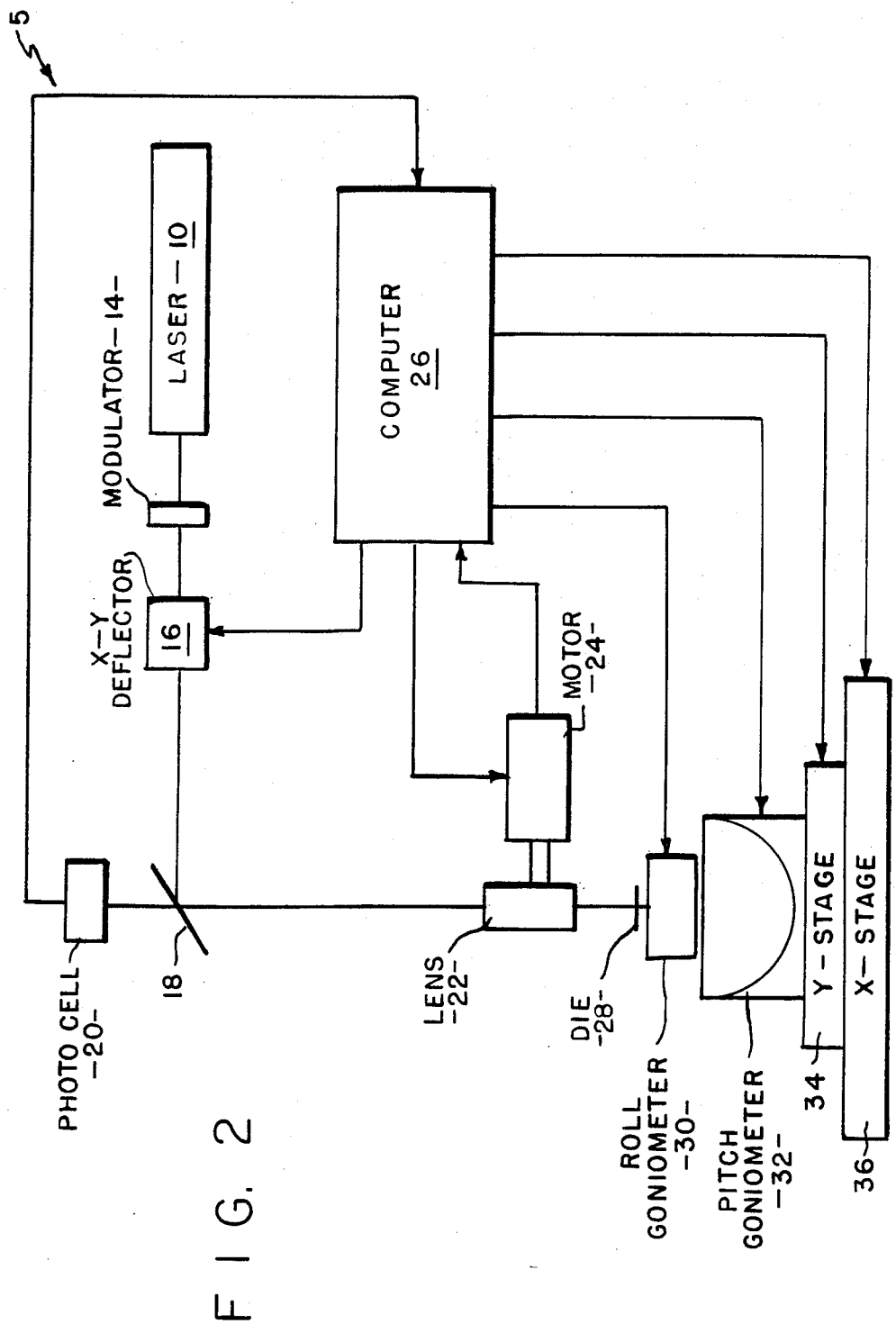
F I G. 2

AUTOMATIC LEVELING SYSTEM AND A METHOD OF LEVELING A WORKPIECE BASED ON FOCUS DETECTION

FIELD OF THE INVENTION

This invention relates to an apparatus for and a method of leveling electronic devices such as a semiconductor die, integrated circuit (IC), IC wafer, or other such components using optical-electronic control equipment. More particularly, this invention relates to an apparatus and a method for determining leveling by illuminating three separate spots on a surface to be leveled and comparing the focus of the light for each spot. The information from the focus comparison can be translated into information which allows the leveling to be performed.

BACKGROUND OF THE INVENTION

With the increasing use of semiconductor chips in industry, automated processing of such chips on a customized basis has become important. Processing chips using lasers has become a more widely used practice. To precisely draw lines onto a semiconductor die using a laser, it is best to keep the surface being drawn on orthogonal to the laser beam. This ensures that the lines will be of a constant width. If the lines should vary in width by as little as a micron, the finished chip may be of little or no use. Likewise, it is important that other electronic devices be kept level when detailed work is performed on them.

While other methods of leveling electronic components are known, the present invention provides a versatile and accurate method of leveling workpiece. One such previous method involves blowing air onto different parts of the surface to be leveled and then sensing the reflected air flow. This method proves to be too imprecise for controlling the leveling of small devices. Another method is to measure the capacitance of the device to be leveled at areas far apart from one another. For large, smooth pieces of equipment such as photomasks for chips, this method has proven itself to work, but for small electronic devices whose topography is rough, this method is ineffective. Devices that are less than ¼ inch on a side are too small to utilize this method effectively.

It is obvious that what is needed is an apparatus adaptable to both large and small surfaces areas as well as surfaces that vary in topography. Such apparatus should be programmable for any type surface and be able to level components as small as IC's.

SUMMARY OF THE INVENTION

In order to overcome the discussed disadvantages of prior apparatus and methods, the present invention provides an apparatus and a method for dealing with small surfaces and varying topography of the surfaces.

By combining the automatic laser focus system disclosed in commonly assigned U.S. patent application No. 07/251,582, the teachings of which are incorporated herein by reference, with the present invention, a controlling computer can receive information from the focusing of a laser beam on several distinct spots, compare the focus data from the spots, determine how best to level the electronic component, and then send signals to drive goniometers of a leveling apparatus.

Other objects, features, and characteristics of the present invention will become apparent upon consideration of the following description and the appended claims with reference to the accompanying drawings, all of which form a part of this specification.

DESCRIPTION OF THE DRAWINGS

By studying the drawings along with the following detailed description of the preferred embodiment, one can more fully appreciate the advantages of the present invention.

FIG. 2 is block diagram of the present invention.

DETAILED DESCRIPTION OF THE PRESENTLY PREFERRED EXEMPLARY EMBODIMENT

Figure 1A:
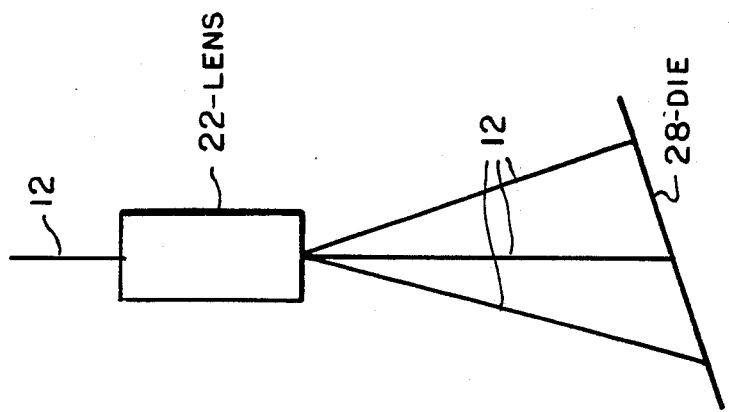
FIG. 1 is a view of a laser beam striking a surface to be leveled when the surface is leveled, 1A, and when the surface is skewed, 1B.

As shown in FIG. 2, the apparatus according to the present invention, generally shown at 5, is controlled by a computer 26 which is responsible for determining the focus as well as positioning the translation stages and goniometers.

The workpiece 28 is positioned under the objective focusing lens 22 by the X-Y linear translation stages 36 and 34, respectively. The workpiece 28 is then positioned so that a laser beam 12, such as from a helium-neon laser with a wavelength of 6328 angstroms, is at one of the workpieces' corners. Using a simple machine vision system based on beam scanning, the corner of the workpiece 28 is more precisely located. The specimen is then traversed so that the machine vision system can locate the position of the diagonally opposite corner.

Figure 1B:
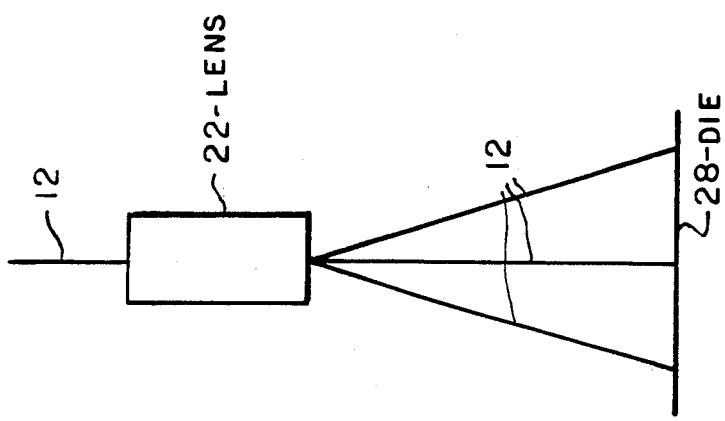

Once the position of the two corners is known, the computer 26 can calculate the position of the workpiece 28. For illustrative purposes only, a semiconductor die will act as the workpiece 28. Before the leveling process begins, the design details of the die are fed to the computer 26. Knowing the design details of the die and the position of the die, the computer 26 causes the translation stages 34, 36 to successively move the die so that the laser beam 12 is directed to three different spots on the die that are widely spaced and have surface detail. In each of these spots, the computer 26 goes through its autofocus routine and determines the relative position of the objective focusing lens 22 when the die is in focus. FIG. 1A shows the laser beam path length for the workpiece 28 being perpendicular to the beam 12, and FIG. 1B shows the path length when the workpiece 28 is not perpendicular to the beam 12.

Referring again to the FIG. 2, the laser beam 12 is emitted from a laser 10 and passes through a modulator 14 and x-y deflector 16. The laser beam 12 falls on the workpiece 28 to be leveled after passing through the objective focusing lens 22. The laser beam is directed towards the objective focusing lens 22 by a beam splitting mirror 18.

To achieve focus, the controlling computer 26 causes the x-y deflector 16 to scan or wobble the laser beam 12 while at the same time the controlling computer 26 causes the focusing motor 24 to drive the objective focusing lens 22 from one end of its range to the other end. Focus is determined when the photocell 20 detects a maximum of high frequency components in the light reflected off the workpiece.

The computer 26 stores the position of the objective focusing lens 22 at best focus and makes use of this information in determining how level the workpiece 28 truly is. The computer 26 then performs the same focusing routine for the other two spots. The computer positions the x and y translation stages, 36 and 34 respectively, so that the same process may be performed on spots spaced apart from the first.

The computer 26 determines the relative position of the objective focusing lens 22 when the workpiece 28 is in focus. From this information, the computer 26 can calculate how far the workpiece 28 is from being level. If the workpiece 28 is level, the relative position of the objective focusing lens 22 is the same for the three spaced aparted positions. The computer 26 transforms the data about the relative positions of the objective focusing lens positions to commands that will level the workpiece 28. The computer 26 sends instructions to the pitch and roll goniometers 32 and 30, respectively, which move so as to level the workpiece 28.

Once the workpiece 28 has been leveled, the leveling process is almost complete. To ensure that all has been done properly, the computer 26 checks the focusing of the three positions again and compares the relative positions of the objective focusing lens 22. If the workpiece 28 is not level, the computer 26 will again move the goniometers.

While the present invention has been described in connection with what is presently considered to be the most practical and preferred embodiment, it is to be understood that the invention is not limited to the disclosed embodiment, but on the contrary, is intended to cover various modifications and arrangements included within the spirit and scope of the appended claims.

What is claimed is:

1. An Automatic leveling apparatus comprising:
    an automatic laser focus system capable of determining the focus of laser light reflected from a workpiece, said automatic laser focus system having a control computer;
    x and y translation stages for moving said workpiece in a plane, said stages controlled by said computer; and
    pitch and roll goniometers controlled by said computer, said goniometers being adjustable so as to level the workpiece based on the determined focus of the laser light.

2. The system of claim 1 wherein the automatic laser focus system comprises:
    a laser for generating a laser beam, said beam being aimed at the workpiece;
    focusing means for focusing said laser beam onto said workpiece;
    means for detecting light reflected from said workpiece; and
    means responsive to said detecting means for generating a focus control signal for controlling the focusing means to focus said laser beam on said workpiece.

3. The system of claim 1 wherein the control computer performs functions including:
    processing data concerning relative positions of an objective lens in focus on three spaced apart positions on the workpiece;
    moving said x and y translation stages so as to translate the workpiece; and
    transforming said data into drive signals for said pitch and roll goniometers to level said workpiece.

4. The system of claim 3 wherein said three different positions are chosen by said computer because said positions are widely separated and high in surface detail.

5. A method of automatically leveling a workpiece comprising the steps of:
    positioning said workpiece under an objective lens using x and y linear translation stages;
    moving said workpiece so that a laser beam is approximately at one corner of said specimen;
    precisely locating said one corner;
    traversing said workpiece so that said laser beam can locate the position of the diagonally opposite corner;
    successively directing said laser beam to three separate spots on the workpiece;
    performing an automatic laser focus routine at each of said three spots;
    calculating, from data generated while performing said focus routines, how for said workpiece is from being level;
    leveling said workpiece by sending signals to pitch and roll gonimeters, said signal directing said goniometers to rotate; and
    checking to ensure that said workpiece is level by performing another automatic laser focus routine and comparing results from the separate spots.

6. The method of claim 5 wherein said one corner is precisely located using a simple machine vision system utilizing beam scanning.

7. The method of claim 5 wherein said three separate spots are chosen so that they are widely separated and have surface detail.

8. The method of claim 5 wherein said automatic laser focus routine comprises the steps of:
    focusing said laser beam in response to a focus control signal onto said workpiece;
    detecting laser light reflected from said workpiece;
    generating a focus control signal when high frequency component of reflected light is a maximum; and
    maintaining said laser beam on said workpiece while position data concerning the position of an objective lens is fed to a control computer.

9. The method of claim 5 wherein said calculation of how far said workpiece is from level is performed by a control computer.

10. The method of claim 9 wherein said signals to said pitch and roll goniometers are sent from a control computer.

* * * * *